(12) United States Patent
Christensen

(10) Patent No.: US 6,921,867 B2
(45) Date of Patent: Jul. 26, 2005

(54) STRESS RELEASE FEATURE FOR PWBS

(75) Inventor: Martin Borcher Christensen, Vaerloese (DK)

(73) Assignee: Nokia Corporation, Espoo (FI)

( * ) Notice: Subject to any disclaimer, the term of this patent is extended or adjusted under 35 U.S.C. 154(b) by 167 days.

(21) Appl. No.: 10/306,155

(22) Filed: Nov. 29, 2002

(65) Prior Publication Data

US 2004/0104041 A1 Jun. 3, 2004

(51) Int. Cl.$^7$ ................................................ H05K 1/00
(52) U.S. Cl. ....................... 174/254; 174/260; 174/261; 174/262
(58) Field of Search ................................. 174/254, 260, 174/262, 255, 261; 361/760, 807, 809; 257/778; 455/90.3, 575, 1

(56) References Cited

U.S. PATENT DOCUMENTS

| | | | | |
|---|---|---|---|---|
| 5,121,297 A | * | 6/1992 | Haas | 361/751 |
| 5,717,556 A | * | 2/1998 | Yanagida | 361/803 |
| 5,923,750 A | * | 7/1999 | Enting et al. | 379/433.03 |
| 6,160,713 A | * | 12/2000 | Floyd et al. | 361/760 |
| 6,256,877 B1 | * | 7/2001 | Hacke et al. | 29/832 |
| 6,370,038 B1 | * | 4/2002 | Miyake et al. | 361/814 |
| 6,633,078 B2 | * | 10/2003 | Hamaguchi et al. | 257/686 |
| 6,754,507 B2 | * | 6/2004 | Takagi | 455/550.1 |

* cited by examiner

Primary Examiner—Kamand Cuneo
Assistant Examiner—Ishwar (I. B.) Patel
(74) Attorney, Agent, or Firm—Antonelli, Terry, Stout & Kraus, LLP

(57) ABSTRACT

An element, such as a PWB or PCB is provided with elongated lower-stiffness areas, which provide the element with areas of a lower deformation during deformation of the element, such as during a fall thereof. Fragile or large electronic or electrical parts, such Integrated Circuits, such as BGAs are positioned at the lower deformation areas in order to maintain electrical connection to the element during and after the deformation of the element.

30 Claims, 2 Drawing Sheets

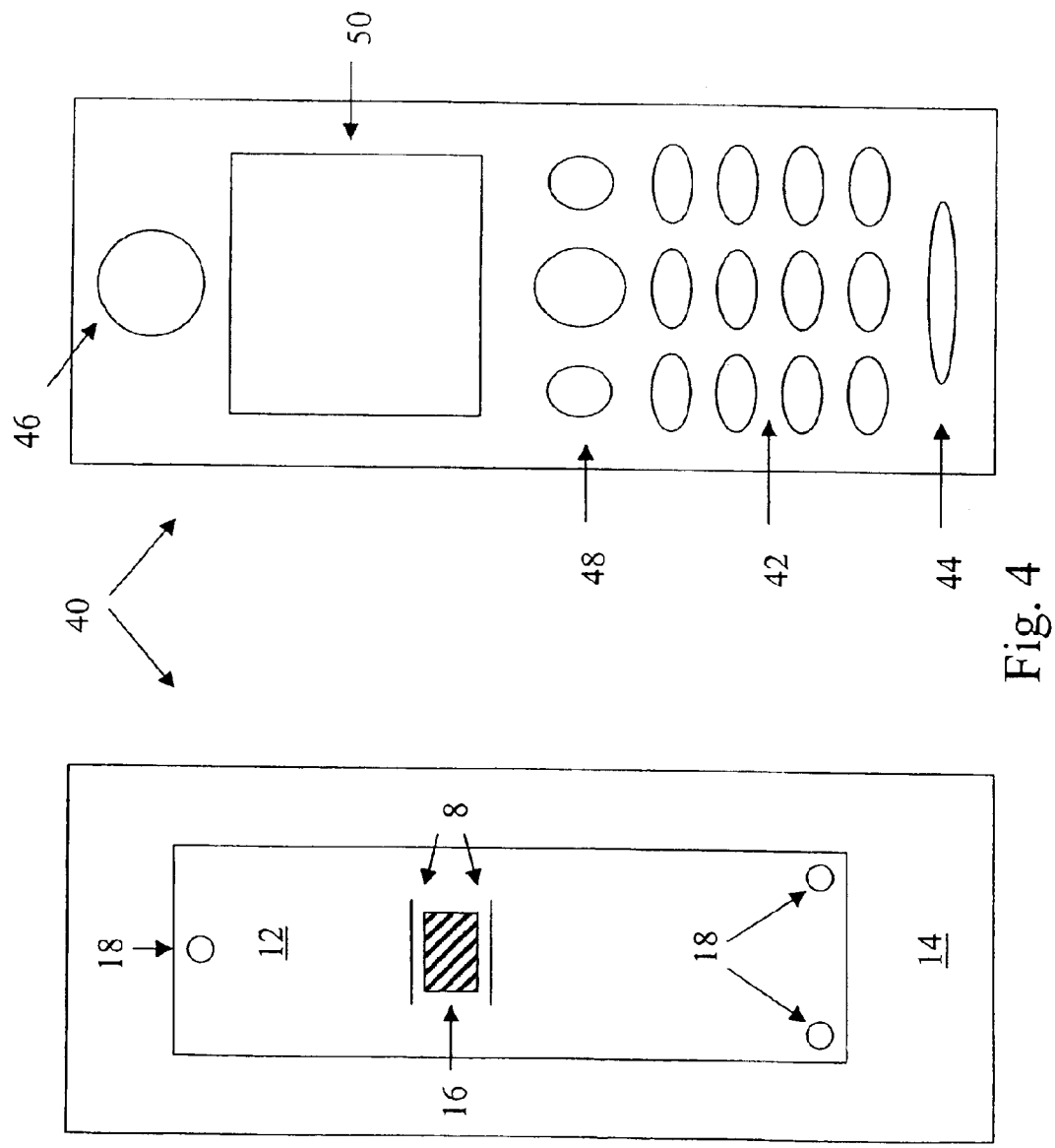

STRESS RELEASE FEATURE FOR PWBS

BACKGROUND OF THE INVENTION

1. Field of the Invention

The present invention relates to an element having a reduced weakness to deformation, and in particular to Printed Circuit Boards (PCBs)/Printed Wiring Boards (PWBs) with Ball Grid Arrays (BGAs) where the BGAs have a reduced likelihood of loosening and thereby loosing electrical contact to the PCBs/PWBs due to deformation of the PWBs/PCBs, such as due to a fall of mobile telephones having the PCBs/PWBs.

2. Description of the Prior Art

It has been found that the BGAs on PWBs in mobile telephones may be loosened at the corners thereof as a result of a fall of the mobile telephone. This is due to the fact that the bending of the PWB due to the fall stresses especially the corners of the BGA.

SUMMARY OF THE INVENTION

It is an object of the present invention to reduce or eliminate the problem of the prior art by providing PWB/PCBs or the like with predefined bending areas so as to reduce the bending at the BGAs or other electrical parts on the PWB/PCB.

Thus, in a first aspect, the present invention relates to an element having:
- one or more electrical conductors thereon or therein,
- one or more electrical or electronic parts attached to the element and in electrical connection with one or more of the conductors,
- the element having one or more elongated bending areas with a stiffness lower than a stiffness of the element in areas adjacent to the bending areas.

In this connection, the element may be a typical PCB, a PWB or the like having a pattern of electrical conductors thereon or therein. It is typical that boards of this type may have numerous layers of conductors provided on top of each other, whereby one layer will be at a surface (covered, however to reduce oxidation and accidental electrical contact thereto) and the other layers will be embedded under this layer. Naturally, the electrical conductors may also be provided as separate wires or the like.

The electric or electronic parts may be any parts used in electronics, such as integrated circuits, resistors, capacitors, coils, transistors, diodes, impedances, inductances, fuses, connectors, conductors; or the like. Normally, the electric or electronic parts are attached to the element by soldering these to the conductors—or pads thereof. Additional attachment may be provided, such as by gluing or other fastening means.

The larger the surface or span between the electrical connections or attachment points of an electric or electronic part, the larger the impact on deformation in that direction. This will become clearer further below.

In the present context, the bending areas are elongated in order to preferably facilitate bending thereof in a predetermined direction so as to define flat or less-bending areas of the element—areas which may comprise parts vulnerable to bending or deformation of the part or element.

In a preferred embodiment, the element has at least substantially the same, first thickness and stiffness over a major area thereof, such as the area if the element except for the elongated areas—but preferably including the adjacent areas, and at least one elongated bending area comprises one or more areas of the element wherein the thickness of the element is less than the first thickness.

Normal PCB/PWB's have the same thickness throughout—the material thereof being the same throughout. The only variation is a small unimportant thickness variation due to the patterns of electrical conductors. Thus, ignoring any effect from the electric/electronic parts, standard PCB/PWB's will have the same stiffness throughout.

According to the invention, this thickness may vary in order to define bending areas and thereby also define areas with less or no bending. Alternatively, naturally, the stiffness and then maybe the material may vary in order to define the bending areas while obtaining an even thickness of the element.

In the present context, the elongated areas need not be defined solely by areas where the thickness is reduced. On example is where, in the preferred embodiment, at least one elongated bending area is defined by one or more through-bores of the element. Thus, the stiffness at individual points of the elongated areas may vary—and the stiffness may at some points, in fact, be the same as that at the adjacent areas. However, the mean stiffness of the elongated areas will be the lower stiffness. In this context, the effect of a through bore or an area of reduced thickness will have a stiffness-reducing effect also on areas immediately adjacent to the bore/area. Thus, such parts will also form part of the elongated area. However, the adjacent areas having the higher stiffness will be areas further away from the bore/area.

Then, in this preferred embodiment, one or more of the lower thickness areas or through bores may be filled with a material having a stiffness lower than that of the adjacent areas.

When providing a lower thickness or a hole, this area may itself be fragile during deformation so that cracks or the like may occur and eventually render the element itself inoperable. A material filled into e.g. a hole may reduce internal stress therein and then avoid or reduce the risk of cracks forming therein. Also, it may be desired to reduce the actual deformation or the speed of the deformation at the bending areas. This may also be obtained using this lower stiffness material.

In another preferred embodiment, one or more of the elongated areas are adjacent to one of the parts. In this manner, the part(s) lying adjacent to an elongated area will be more protected from the effects of deformation than other parts on the element. This will be more clearly described below.

Another aspect of the invention relates to an assembly having an element as described above and a base part, the element being attached to the base part at one or more points or areas of the element.

In this situation, the deformation of the element will be defined by the attachment points and the direction of the force applied. Thus, it is clear that even from the start, the deformation may be controlled by suitable selection of the attachment points. The deformation can, however, hardly be avoided by this selection.

In this aspect, preferably, the elongated areas are:
at least substantially perpendicular to:
a line from the part to a point, or
a line between two points or
at least substantially parallel to:
a line between two points.

The deformation of an element attached at one or more attachment points will, especially in the event where the base part is suffer than the element, be defined by the force applied and the positions of the attachment points.

If two distant attachment points are provided, the deformation will normally be along (meaning the direction along which the largest deformation is seen) a straight line between the two attachment points or along a line perpendicular thereto. If more attachment points are provided, the pattern may become more complex. However, it will be within the capabilities of the skilled person to take the positions of the attachment points and the distances therebetween into account and to determine the most probable direction of deformation.

In another embodiment, at least one of the elongated areas are directed at least substantially perpendicularly to a line defined by a direction of the element in which the element is the most deformed when a force is provided to the element at the part and at least substantially perpendicularly to the element.

In this manner, instead of arriving at a smoothed, curved shape during deformation, the elongated areas may divide the deformation into sections, which are more flat and straight. In this manner, the parts in those sections have a reduced risk of getting detached and disconnected from the element.

A preferred aspect of the invention relates to a mobile telephone comprising an element or an assembly as described above, preferably wherein at least one part is an integrated circuit and wherein at least one elongated area is provided adjacent to the integrated circuit.

Another aspect of the invention relates to a method of providing an element having:

one or more electrical conductors thereon or therein, and one or more electrical or electronic parts attached to the element and in electrical connection with one or more of the conductors, the method comprising providing, in the element, one or more elongated bending areas with a stiffness lower than a stiffness of the element in areas adjacent to the bending areas.

Naturally, the order of providing the conductors, the parts and the areas will be unimportant. These different elements may be provided in any order suitable in the individual situation.

In this aspect, the element may have at least substantially the same, first thickness and stiffness over a major area thereof and the method may then comprise providing at least one elongated bending area as one or more areas of the element wherein the thickness of the element is lower than the first thickness. In one situation, the step of providing at least one elongated bending area could comprise providing one or more through-bores of the element. Then, the step of providing the one or more lower thickness areas or through bores could comprise filling, into the lower thickness areas or through bores, a material having a stiffness lower than that of the adjacent areas.

Preferably, as is also described above, the step of providing the elongated area(s) comprises providing one or more of the elongated areas adjacent to one of the parts.

A further aspect of the invention relates to a method of providing an element with a base part, the method comprising providing an element according to the previous aspect and attaching the element to the base part at one or more points or areas of the element.

Then, preferably, the step of providing the elongated area(s) comprises providing one or more elongated areas, which are:

at least substantially perpendicular to:

a line from the part to a point, or a line between two points, or at least substantially parallel to:

a line between two points.

Also, the step of providing the elongated area(s) may comprise providing at least one elongated area which is directed at least substantially perpendicularly to a line defined by a direction of the element in which the element is the most deformed when a force is provided to the element at the part and at least substantially perpendicularly to the element.

BRIEF DESCRIPTION OF THE DRAWINGS

In the following, preferred embodiments of the invention will be described with reference to the drawings, wherein FIG. 4 illustrates a mobile telephone having an element.

DESCRIPTION OF THE PREFERRED EMBODIMENT

Figure 1:
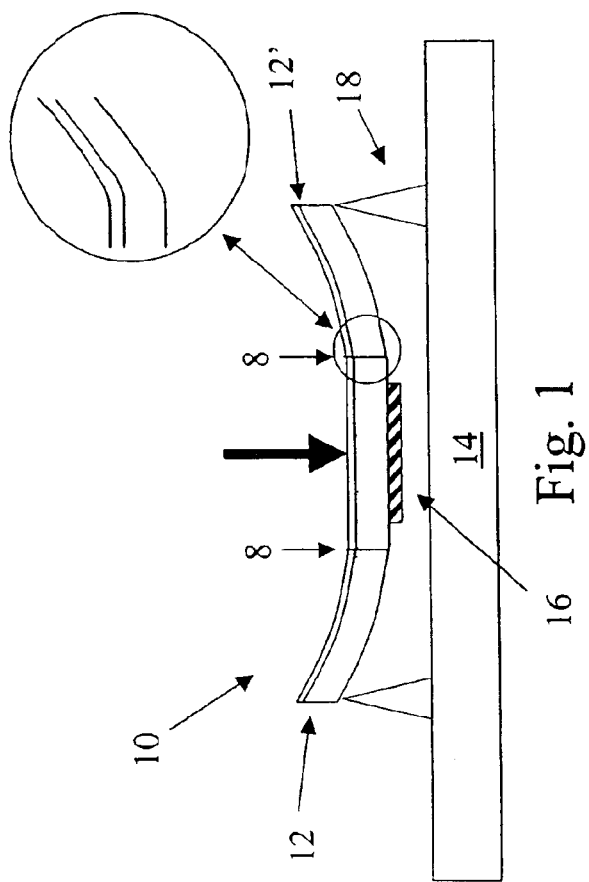
FIG. 1 is a side view of an assembly illustrating deformation of the element.

FIG. 1 illustrates an assembly 10 having an element 12 on which an electric part 16 is fixed. The element 12 is preferably a PCB or a PWB, such as in a mobile telephone. PCBs and PWBs have a number of electrical conductors 12' provided in one or more layers thereof—of which one is positioned adjacently to a surface thereof. The part 16 may be any electric part, such as a resistor or an integrated circuit, such as a BGA chip. The BGA chip is normally attached to the PWB by solder joints in order to also provide electric connection between the electrical conductors in the PWB/PCB.

The preferred PWB/PCB has the same thickness (ignoring any thickness variations due to manufacturing imperfections and the patterns of the electrical conductors) all over except at the bending areas. The assembly also has a base 14 on which the PWB 12 is fixed at points defined by the cones 18.

During, for example, a fall of the assembly 10, the PWB 12 will flex as illustrated by the fat arrow describing a force provided to the PWB 12.

Normally, during bending of the element 12, especially the corners or edges of the part 16 will be exposed to stress forces attempting to disengage the part 16 from the PWB 12.

In the present embodiment, flexing zones or bending areas 8 are provided which take up all or a major part of the deformation so that the area in which the part 16 is positioned is still at least substantially flat—even during the described flexing/force providing.

Figure 2:
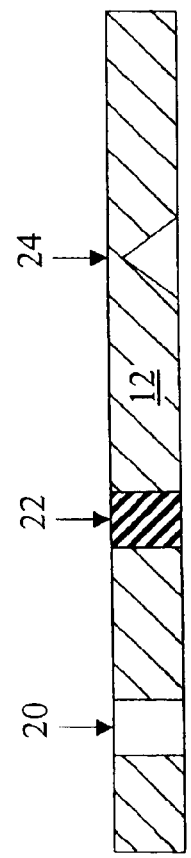
FIG. 2 illustrates different examples of providing bending areas with a reduced stiffness.

In FIG. 2, different manners of obtaining a flexing point or line are seen. The easiest to manufacture is a simple hole or cut-through 20. This is a hole extending all the way through the PWB 12.

Another manner is to fill the hole 20 with a material 22 less stiff than that of the PWB 12 in order to either reduce the flexing or in order to reduce damages to the PWB during flexing.

A third manner is one where only part of the material along the thickness of the PWB is removed—such as in the form of a wedge 24. This has the advantage over the two other manners that the full area of the PWB 12 around the part 16 may be used for electrical conductors 12' to and from the part 16. Naturally, the hole or wedge 24 may also be filled with a material of less stiffness than that of the PWB 12.

Figure 3:
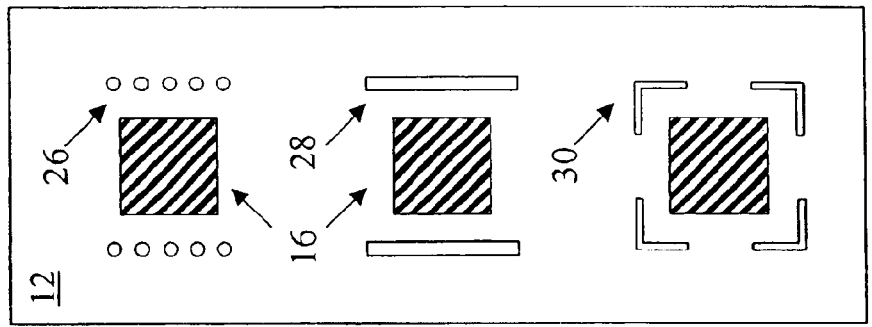
FIG. 3 illustrates different manners of providing elongated bending areas.

Normal PWBs/PCBs are relatively stiff so that when they flex, it will be along one (the one illustrated in FIG. 1) direction, whereby substantially no flexing will take place at a direction perpendicular to the flexing direction (that perpendicular to the paper in FIG. 3).

In that situation, it is especially suitable to provide the flexing areas as elongated areas in specific directions in relation to the flexing directions.

FIG. 3 illustrates different manners of providing elongated flexing or bending areas. At the top of FIG. 3, a number of holes 26 are provided in the PWB 12 and adjacently to the part 16.

In the middle of FIG. 3, the holes 16 have been replaced by elongated holes or grooves 28.

It is seen that when the PWB 12 is flexed as illustrated in FIG. 1, the holes 26 and 28 will provide elongated areas or zones taking up the flexing and leaving the middle area with the part 16 substantially free of flexing.

At the bottom of FIG. 3, angled grooves or holes 30 are provided. These have the same effect—but now protect the element 16 from flexing along multiple directions.

Naturally, the holes/grooves 26, 28, and 30 may be made by any of the manners seen in FIG. 2.

The preferred embodiment is for use in a mobile telephone. FIG. 4 illustrates a disassembled mobile telephone 40 having, in a bottom thereof, the PWB 12 attached to the housing 14 of the telephone at points 18—such as defined by screws, glued points, or other attaching/locking means. The front of the telephone 40 is a standard front having a keyboard 42, a microphone 44, a loudspeaker 46, navigating keys 48, and a display 50.

The PWB 12 has a part 16 attached thereto and elongated bending/flexing areas 8 perpendicular to the major flexing direction being the direction (defined by the points 18) along the longitudinal axis of the telephone 40. Hardly any deformation will be seen in the direction along the width of the telephone.

It should be noted that the flexing of the PWB 12 would depend on the actual positions of the points 18 defining the fixed points during the flexing of the PWB 12, as well as the distribution of the weight of the PWB 12 and any parts 16 thereof. The skilled person would be able to determine this direction.

In the example of FIG. 4, two directions of flexing are, actually possible. One direction being the above described direction along the longitudinal direction of the telephone 40, the other one being along the width of the telephone 40.

The flexing direction actually "chosen" will be defined by the stiffness of the PWB in the two directions (which stiffness will normally be the same) and the distance over which the flexing occurs. Due to the fact that the direction from a straight line between the two bottom points 18 and the upper point 18 is much larger than the distance between the two bottom points 18, any force exertion on the part 16 will make the PWB flex along the longitudinal direction. If the two distances were the same or similar, the flexing might also occur in the other direction, whereby a flexing protection as that seen at the bottom of FIG. 3 may be desired.

What is claimed is:

1. An element comprising:
    at least one electrical conductor thereon or therein;
    at least one electrical or electronic part attached to the element and in electrical connection with at least one conductor; and
    the element including at least one elongated bending area with a stiffness lower than a stiffness of the element in areas adjacent to the bending areas; and
    wherein at least one elongated bending area is defined by at least one through hole in the element and at least one of the at least one through hole is filled with a material having a stiffness lower than that of an area adjacent to the at least one filled through hole.

2. An element according to claim 1, wherein the element has at least substantially a first thickness and stiffness over a major area thereof and wherein the at least one elongated bending area comprises at least one area of the element wherein a thickness of the element is less than the first thickness.

3. An element according to claim 2, where the at least one area of lower thickness is filed with a material having a stiffness lower than that of an adjacent area.

4. An element according to any one of the claims 1–3 wherein at least one of the elongated areas is adjacent to one of the parts.

5. An assembly including an element according to claim 1 and a base part wherein the element is attached to the base part at at least one point or area of the element.

6. An assembly according to claim 5, wherein:
    at least one of the at least one elongated area is directed at least substantially perpendicularly to a line defined by a direction of the element in which the element is most deformed when a force is provided to the element at a part and at least substantially perpendicular to the element.

7. An assembly including an element according to claim 2 and a base part wherein the element is attached to the base part at at least one point or area of the element.

8. An assembly according to claim 7, wherein:
    at least one of the at least one elongated area is directed at least substantially perpendicularly to a line defined by a direction of the element in which the element is most deformed when a force is provided to the element at a part and at least substantially perpendicular to the element.

9. An assembly including an element according to claim 3 and a base part wherein the element is attached to the base part at at least one point or area of the element.

10. An assembly according to claim 9, wherein:
    at least one of the at least one elongated area is directed at least substantially perpendicularly to a line defined by a direction of the element in which the element is most deformed when a force is provided to the element at a part and at least substantially perpendicular to the element.

11. An assembly including an element according to claim 4 and a base part wherein the element is attached to the base part at at least one point or area of the element.

12. An assembly according to claim 11, wherein:
    at least one of the at least one elongated area is directed at least substantially perpendicularly to a line defined by a direction of the element in which the element is most deformed when a force is provided to the element at a part and at least substantially perpendicular to the element.

13. An assembly according to claim 2, wherein:
the at least one elongated bending area is at least one of substantially perpendicular to a line from a part to a point of a line between two points, or is at least substantially parallel to a line between two points.

14. An assembly according to claim 13, wherein:
at least one of the at least one elongated area is directed at least substantially perpendicularly to a line defined by a direction of the element in which the element is most deformed when a force is provided to the element at a part and at least substantially perpendicular to the element.

15. A mobile telephone comprising an element according to claim 1.

16. A mobile telephone according to claim 15, wherein at least one part is an integrated circuit and wherein the at least one elongated bending area is provided adjacent to the integrated circuit.

17. A mobile telephone comprising an assembly according to claim 2.

18. A mobile telephone according to claim 17, wherein at least one part is an integrated circuit and wherein the at least one elongated bending area is provided adjacent to the integrated circuit.

19. A mobile telephone comprising an element according to claim 3.

20. A mobile telephone according to claim 19, wherein at least one part is an integrated circuit and wherein at least one elongated bending area is provided adjacent to the integrated circuit.

21. A mobile telephone comprising an element according to claim 4.

22. A mobile telephone according to claim 21, wherein at least one part is an integrated circuit and wherein at least one elongated bending area is provided adjacent to the integrated circuit.

23. A mobile telephone comprising an assembly according to claim 5.

24. A mobile telephone according to claim 23, wherein at least one part is an integrated circuit and wherein at least one elongated bending area is provided adjacent to the integrated circuit.

25. A mobile telephone comprising an assembly according to claim 7.

26. A mobile telephone according to claim 25, wherein at least one part is an integrated circuit and wherein at least one elongated area is provided adjacent to the integrated circuit.

27. A mobile telephone comprising an assembly according to claim 9.

28. A mobile telephone according to claim 27, wherein at least one part is an integrated circuit and wherein at least one elongated bending area is provided adjacent to the integrated circuit.

29. A mobile telephone comprising an assembly according to claim 11.

30. A mobile telephone according to claim 29, wherein at least one part is an integrated circuit and wherein at least one elongated bending area is provided adjacent to the integrated circuit.

* * * * *